(12) United States Patent
Tsukada et al.

(10) Patent No.: US 6,232,558 B1
(45) Date of Patent: May 15, 2001

(54) ELECTRONIC COMPONENT MOUNTING BASE BOARD HAVING HEAT SLUG WITH SLITS AND PROJECTIONS

(75) Inventors: Kiyotaka Tsukada; Hisashi Minoura; Koji Asano; Naoto Ishida, all of Ohgaki; Morio Nakao, Hayami-Gun, all of (JP)

(73) Assignees: Ibiden Co., Ltd., Ohgaki (JP); Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/064,770

(22) Filed: Apr. 23, 1998

(30) Foreign Application Priority Data

Apr. 30, 1997 (JP) .................................................. 9-128057

(51) Int. Cl.⁷ ...................................................... H05K 1/00
(52) U.S. Cl. ............................ 174/252; 174/263; 165/185
(58) Field of Search ..................... 174/252, 263, 174/262; 361/704, 705, 707, 717, 718, 719, 709, 710, 711, 712; 165/80.3, 185

(56) References Cited

U.S. PATENT DOCUMENTS

| 4,679,118 | * | 7/1987 | Johnson et al. | 361/718 |
| 5,037,782 | * | 8/1991 | Nakamura et al. | 438/167 |
| 5,295,043 | * | 3/1994 | Beijer | 361/704 |
| 5,500,785 | * | 3/1996 | Funada | 361/720 |
| 5,548,090 | * | 8/1996 | Harris | 174/252 |
| 5,914,859 | * | 6/1999 | Takada et al. | 361/704 |
| 5,920,458 | * | 7/1999 | Azar | 361/704 |

FOREIGN PATENT DOCUMENTS

| 6-302722 | 10/1994 | (JP) . |
| 6-326151 | 11/1994 | (JP) . |
| 8-97329 | 4/1996 | (JP) . |
| 9-67408 | 3/1997 | (JP) . |
| 10-22324 | 1/1998 | (JP) . |
| 10-22589 | 1/1998 | (JP) . |
| 10-261861 | 9/1998 | (JP) . |
| 10-284821 | 10/1998 | (JP) . |

* cited by examiner

Primary Examiner—Jeffrey Gaffin
Assistant Examiner—Kamand Cuneo
(74) Attorney, Agent, or Firm—Oliff & Berridge, PLC

(57) ABSTRACT

An electronic component mounting base board has an insulating substrate provided with a conductor circuit and a mount portion for an electronic component, and a heat slug adhered to the insulating substrate, wherein the heat slug is comprised of a flat main body and a projection portion extending vertically from a side face of the main body, and provided with a slit deforming portion absorbing deformation of the insulating substrate.

7 Claims, 9 Drawing Sheets

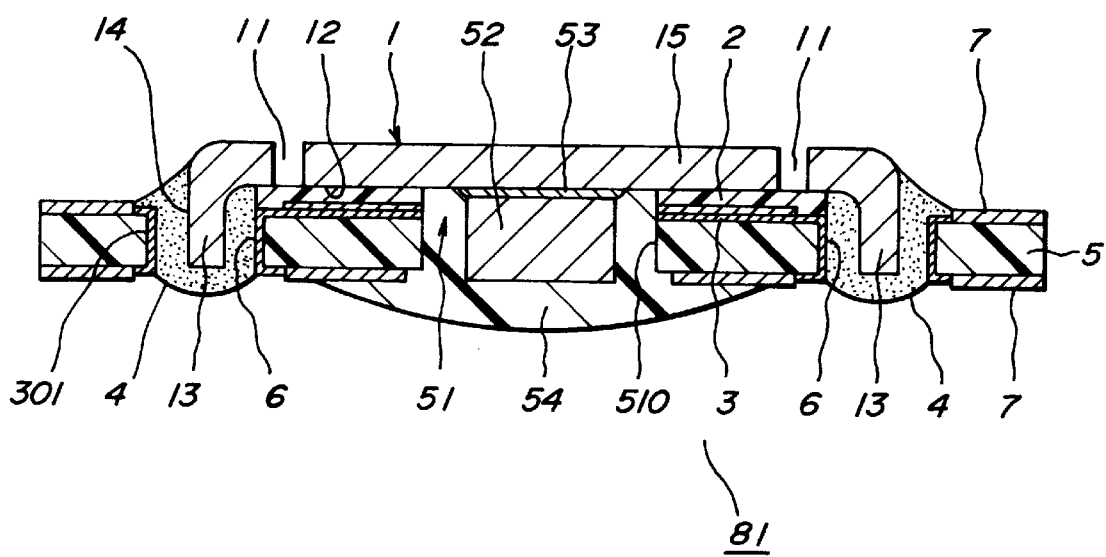
FIG_1

FIG_2
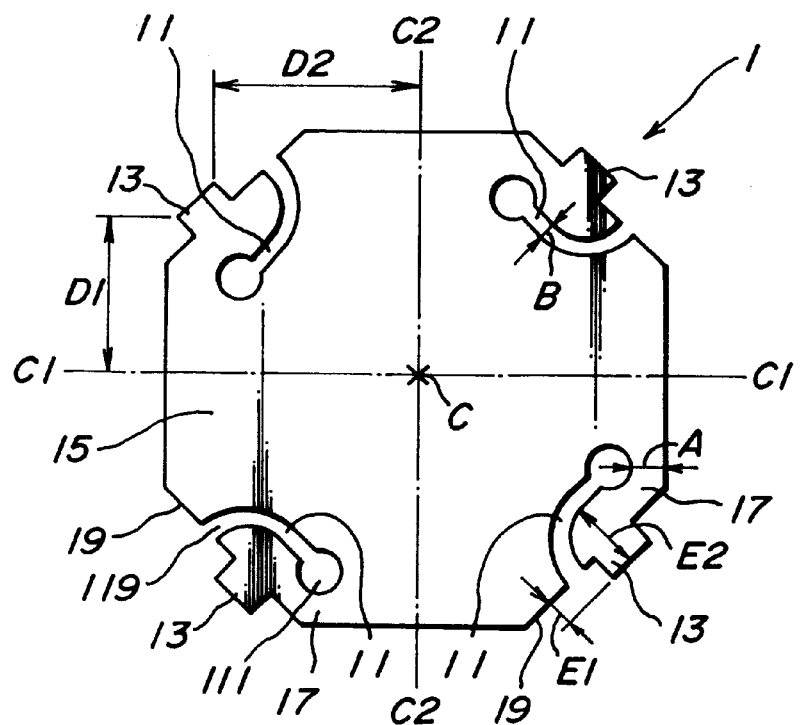
FIG_3
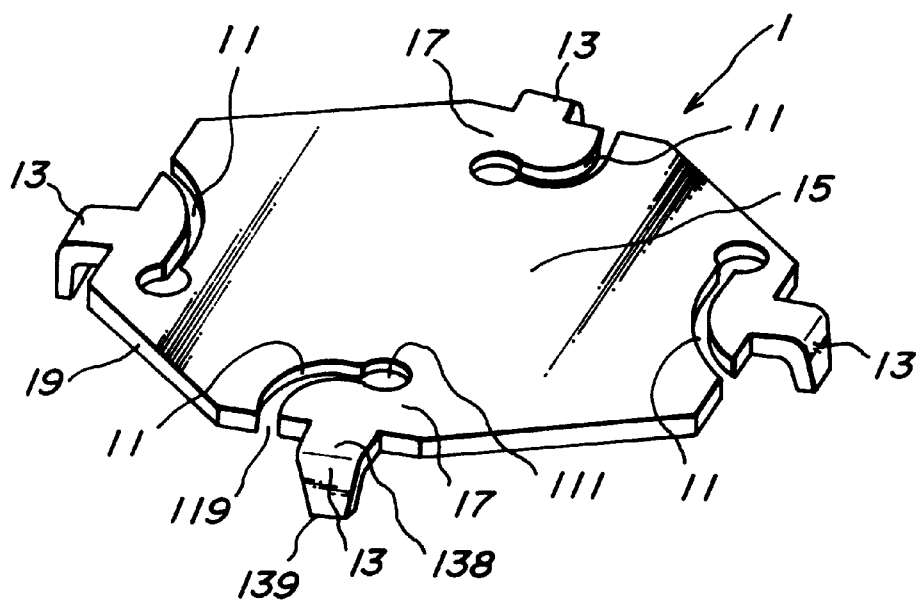

FIG_4
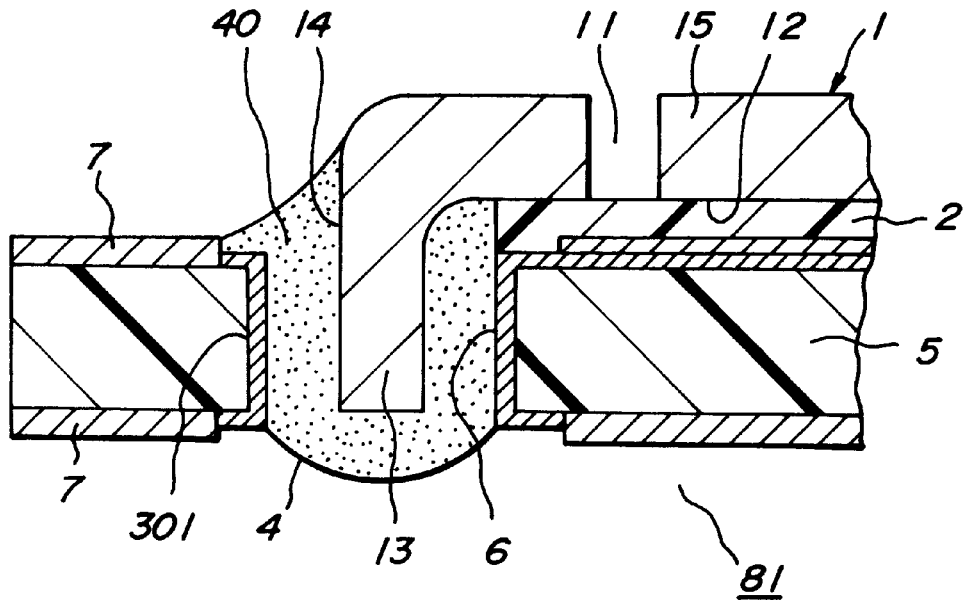
FIG_5
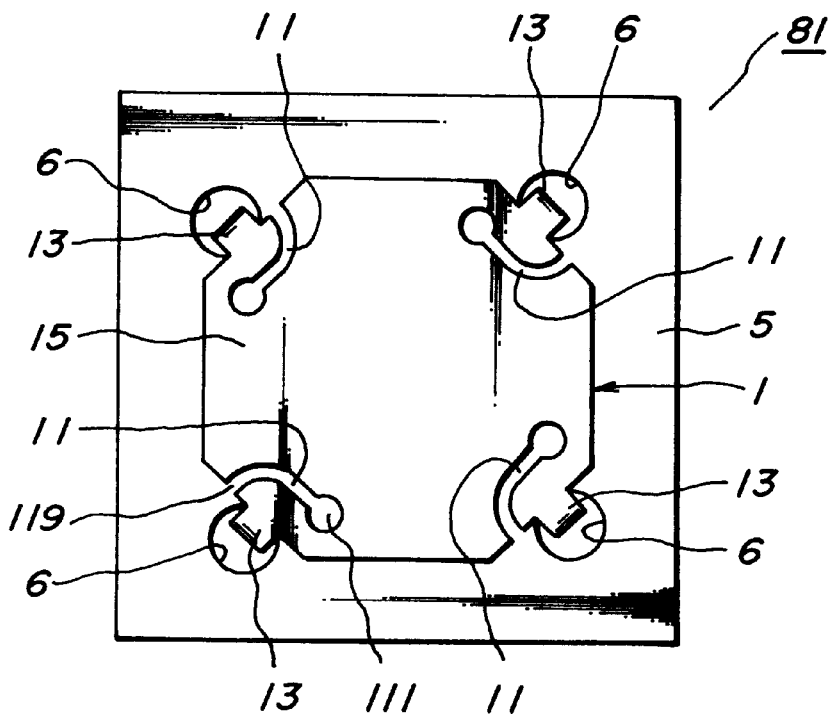

FIG_6
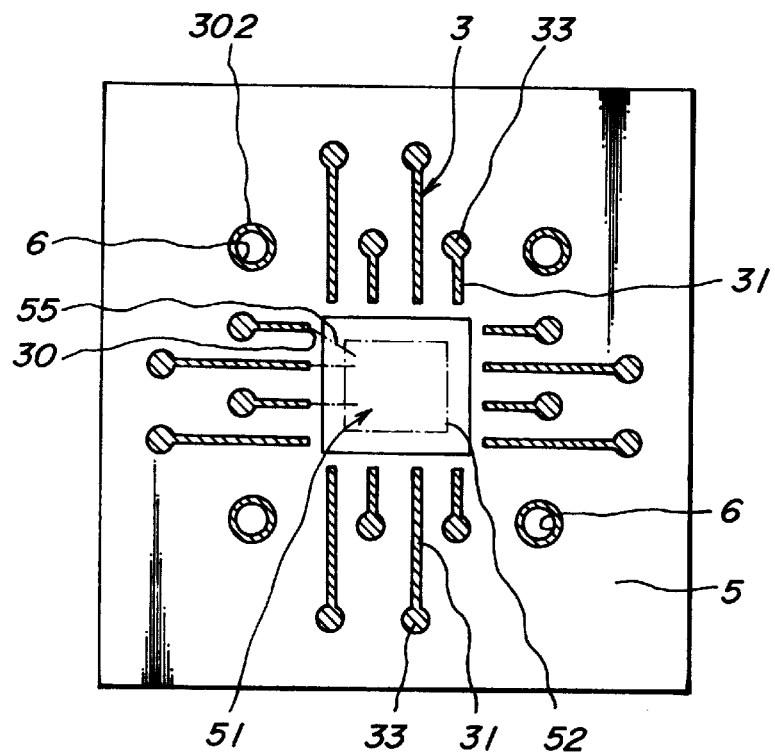
FIG_7
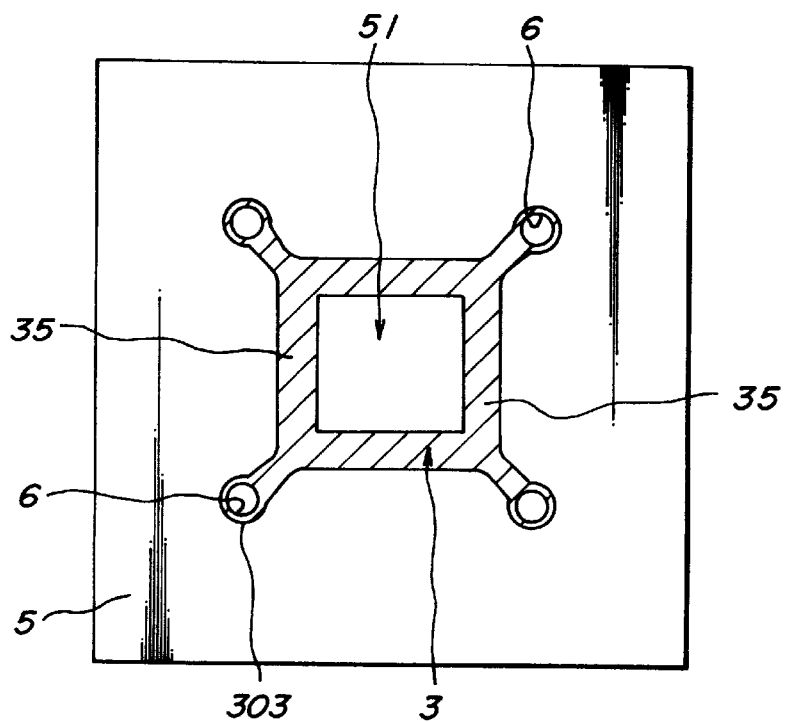

FIG_10
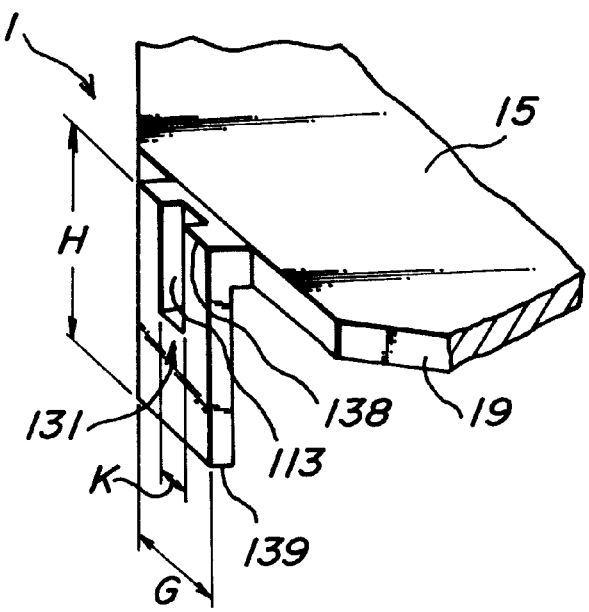
FIG_11
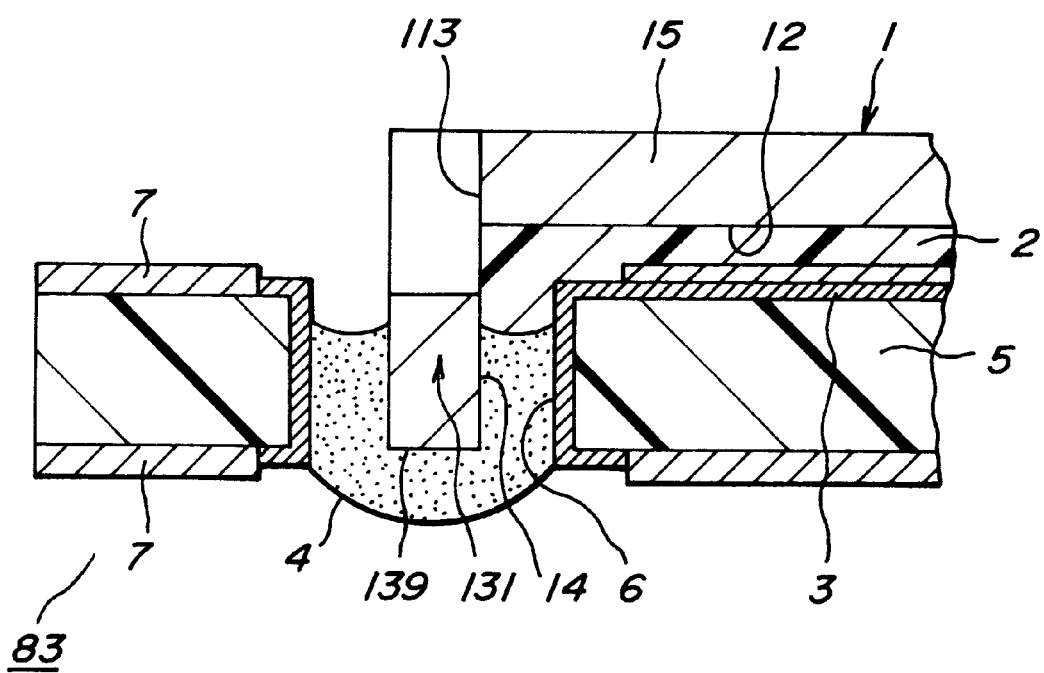

FIG_15
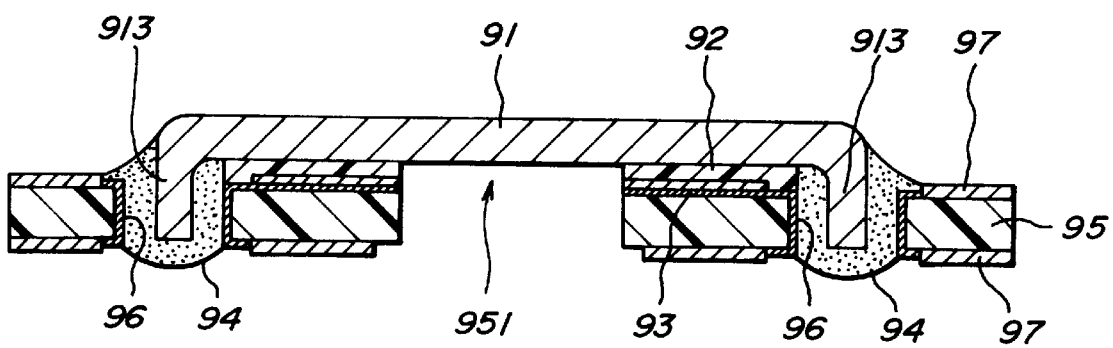
FIG_16
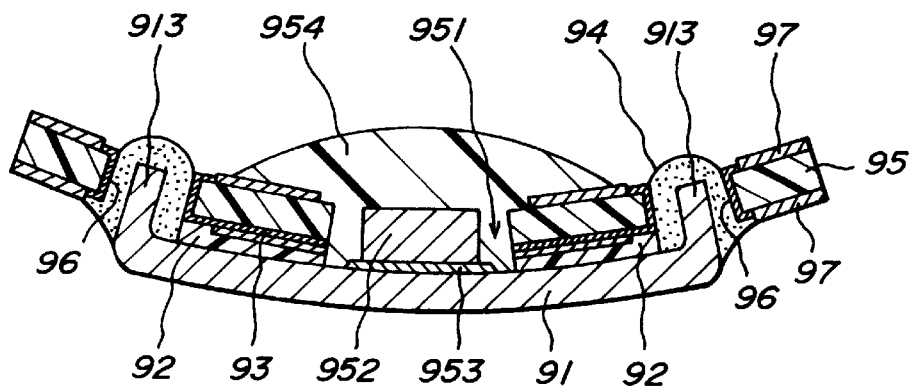

ELECTRONIC COMPONENT MOUNTING BASE BOARD HAVING HEAT SLUG WITH SLITS AND PROJECTIONS

BACKGROUND OF THE INVENTION

1. Field of the Invention

This invention relates to an electronic component mounting base board, and more particularly to a structure of an electronic component mounting base board for preventing the occurrence of warping in the base board during the sealing with a resin after the mounting of the electronic component.

2. Description of Related Art

As the electronic component mounting base board, there was a base board formed by adhering and fixing a heat sink to a surface of an insulating substrate in the past. In this case, the positioning of the insulating substrate and the heat sink was carried out by using a positioning guide.

The inventors have already proposed an electronic component mounting base board of a structure capable of facilitating the positioning between the substrate and the heat sink (Japanese Patent Application No. 9-67408). That is, as shown in the comparative example of FIGS. 15 and 16, a projection portion 913 extending from a side face of a heat slug 91 is inserted into a positioning hole 96 formed in an insulating substrate 95 and joined and fixed to the substrate through a solder 94. Thus, the positioning between the heat slug 91 and the insulating substrate 95 is carried out by inserting the projection portion 913 into the positioning hole 96.

An insulating resin adhesive layer 92 is interposed between the heat slug 91 and the insulating substrate 95.

And also, a conductor circuit 93 is formed on the insulating substrate 95, while the surface of the insulating substrate 95 is covered with a solder resist 97.

In substantially a central portion of the insulating substrate 95 is formed a concave mount portion 951 for mounting an electronic component. As shown in FIG. 16, an electronic component 952 is adhered onto the mount portion 951 through an adhesive 953 and thereafter a sealing resin 954 is filled in the mount portion 951.

In the sealing of the mount portion 951 with the sealing resin 954, however, the sealing resin is filled into the mount portion 951 at a molten state and then cured. As a result, the sealing resin 954 shrinks as shown in FIG. 16, but the heat slug 91 does not shrink. For this end, a side of the insulating substrate 95 opposite to the heat slug 91 is shrunk by the shrinkage of the sealing resin 954 to cause warping of the insulating substrate 95. In case of causing such a warping, the connection reliability of the electronic component mounting base board to a surface mount device lowers.

SUMMARY OF THE INVENTION

It is, therefore, an object of the invention to solve the above problems of the conventional technique and to provide an electronic component mounting base board capable of preventing the occurrence of warping in the insulating substrate when the mount portion for the electronic component is sealed with the resin.

According to the invention, there is the provision of an electronic component mounting base board comprising an insulating substrate provided with a conductor circuit and a mount portion for an electronic component, and a heat slug adhered to the insulating substrate, wherein said heat slug is comprised of a flat main body arranged face to the insulating substrate and a projection portion extending vertically from a side face of the main body, and the main body is adhered to the insulating substrate through a resin adhesive layer, and the projection portion is inserted into a positioning hole and joined to the insulating substrate through a solder, and the heat slug is provided with a deforming portion absorbing deformation of the insulating substrate between a resin-adhered region of the main body and a solder-joined region of the projection portion.

DESCRIPTION OF PREFERRED EMBODIMENTS

According to the invention, it has been noticed that the warping of the insulating substrate in the resin-sealing of the mount portion of the electronic component is caused by the heat slug being harder than the insulating substrate. In the invention, therefore, the deforming portion is formed in the heat slug from a material harder than the insulating substrate to absorb the deformation of the insulating substrate.

In the electronic component mounting base board according to the invention, the deforming portion capable of absorbing the deformation of the insulating substrate is formed between the resin-adhered region of the main body and the solder-joined region of the projection portion in the heat slug. This deforming portion deforms with the deformation of the insulating substrate. As a result, when the mount portion for the electronic component is sealed with the resin, the insulating substrate deforms and also the deforming portion of the heat slug deforms accompanied with the deformation of the insulating substrate, whereby the occurrence of warping in the insulating substrate can be prevented.

And also, the resin adhesive layer made from a soft material is interposed between the main body of the heat slug and the insulating substrate. Therefore, the resin adhesive layer can absorb the deformation of the insulating substrate, so that the warping of the insulating substrate can more effectively be controlled.

On the other hand, the projection portion of the heat slug is inserted into the positioning hole and joined thereto through the solder. That is, the solder filled in the positioning hole strongly joins the projection portion therein to ensure the connection of the heat slug to the insulating substrate.

As previously mentioned, the deforming portion is formed between the resin-adhered region of the main body and the solder-joined region of the projection portion in the heat slug and deforms accompanied with the deformation of the insulating substrate, so that the influence of the deformation of the insulating substrate upon the solder-joined region can be prevented. As a result, the strong solder-joining strength can be maintained between the projection portion and the positioning hole of the insulating substrate.

According to the invention, therefore, the occurrence of the warping in the insulating substrate can be prevented when the mount portion for the electronic component is sealed with the resin.

The word "between the resin-adhered region of the main body and the solderjoined region of the projection portion" used herein means a zone between a part of the main body adhered with the resin adhesive layer and a part of the projection portion joined with the solder.

In a preferable embodiment of the invention, the deforming portion is formed in a periphery of a part of the main body extending the projection portion in the heat slug. In another preferable embodiment of the invention, the deforming portion is formed in a part of the projection portion adjacent to the main body. Thus, the warping of the insulating substrate can effectively be prevented.

In the other preferable embodiment of the invention, the deforming portion is a slit, which can effectively prevent the warping of the insulating substrate.

In a still further embodiment of the invention, an end portion of the slit is opened and the other end portion is closed by a connection portion connecting the resin-adhered region to the solderjoined region. In this case, the slit is more deformable and easily follows the deformation of the insulating substrate. Therefore, the warping of the insulating substrate can be more controlled.

In another preferable embodiment of the invention, both end portions of the slit are closed by a joint portion connecting the resin-adhered region to the solder-joined region. Thus, the connection strength between the main body and the projection portion in the heat slug can be enhanced. In this case, the end portion of the slit closed by the joint portion is favorable to be a curved form. Thus, the occurrence of cracks in the end portion of the slit can be prevented when the slit deforms accompanied with the deformation of the insulating substrate.

In the other preferable embodiment of the invention, the deforming portion is a thin portion having a thickness thinner than that of the main body. This can more absorb the warping of the insulating substrate to effectively control the warping of the insulating substrate. In this case, it is favorable that the thickness of the thin portion is 1–70% of the thickness of the main body. Thus, the thin portion can flexibly follow the deformation of the insulating substrate to control the warping of the insulating substrate while highly maintaining the connection strength between the resin-adhered region and the solder-joined region. When the thickness is less than 1%, it is difficult to absorb the deformation of the insulating substrate, while when it exceeds 70%, there is caused a fear of lowering the connection strength between the resin-adhered region and the solder-joined region in the heat slug.

The formation of the deforming portion in the heat slug is carried out, for example, by laser beam machining, chemical etching or the like. When the deforming portion is a relatively wide-width slit, it may be formed by press molding or the like.

The thickness of the heat slug is preferable to be 0.1–0.7 mm. In this case, there can be obtained heat slugs facilitating the formation of the deforming portion and having a high mechanical strength. When the thickness is less than 0.1 mm, the mechanical strength of the heat slug lowers, while when it exceeds 0.7 mm, the strength of the heat slug becomes higher and hence there is caused a fear of isolating the deformation of the deforming portion to warp the insulating substrate and also it is difficult to form the deforming portion.

The projection portion of the heat slug may take various forms such as rectangle, trapezoid having a width tapered toward a top end, T-shaped form, round form, ellipse and the like.

As the heat slug, it is preferable to use a metal plate of copper (Cu), aluminum (Al), iron (Fe), nickel (Ni), tungsten (W) or an alloy thereof.

As the insulating substrate, use may be made of a resin substrate such as epoxy resin, polyimide resin, bismaleimide triazine or the like, and a composite resin substrate comprised of such a resin and glass, and so on.

In the insulating substrate are formed, for example, the mount portion for the electronic component, the conductor circuit, and the positioning hole.

The mount portion for the electronic component is a portion sealed with the sealing resin after the mounting of the electronic component. The mount portion may be formed in a face of the insulating substrate opposite to an adhesion face thereof to the heat slug (which is referred to as an upper face hereinafter, and the adhesion face is a lower face), or may be a concave recess formed on the upper face of the insulating substrate. Alternatively, a through-hole may be formed in the insulating substrate to dispose the heat slug in the bottom of the through-hole.

The conductor circuit is formed on the surface or the inside of the insulating substrate.

The positioning hole is a hole for inserting the projection portion of the heat slug to position the heat slug and the insulating substrate. It is favorable that the positioning hole has approximately the same size as the projection portion. In this case, the position between the heat slug and the insulating substrate can exactly be determined by inserting the projection portion into the positioning hole.

It is preferable that the inner wall of the positioning hole is covered with a metal plated film. Thus, the solder is strongly joined to the inner wall of the positioning hole and hence the projection portion can strongly be joined to the positioning hole.

BRIEF DESCRIPTION OF THE DRAWINGS

The invention will be described with reference to the accompanying drawings, wherein:

FIG. 1 is a diagrammatically section view of a first embodiment of the electronic component mounting base board according to the invention;

FIG. 2 is a plan view of a heat slug in the first embodiment;

FIG. 3 is a perspective view of the heat slug in the first embodiment;

FIG. 4 is a diagrammatically enlarged section view of a main part of the electronic component mounting base board according to the first embodiment;

FIG. 5 is a schematic view illustrating an arrangement of an insulating substrate and a heat slug in the first embodiment;

FIG. 6 is a rear view of an insulating substrate illustrating an opening side for a mount portion in the first embodiment;

FIG. 7 is a plan view of an insulating substrate illustrating an adhesion side for the heat slug in the first embodiment;

FIG. 10 is a partial perspective view of a heat slug in a third embodiment of the invention;

FIG. 11 is a diagrammatically section view of a main part of the electronic component mounting base board in the third embodiment;

FIG. 15 is a diagrammatically section view of an electronic component mounting base board as a comparative example; and FIG. 16 is a schematic view illustrating a problem point in the comparative example.

Figure 8:
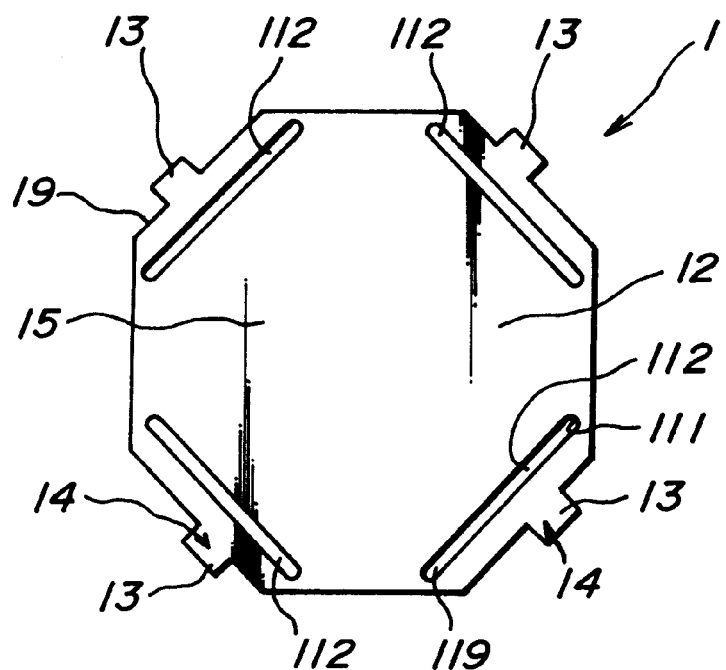
FIG. 8 is a plan view of a heat slug in a second embodiment of the invention.

A first embodiment of the electronic component mounting base board according to the invention will be described below with reference to FIGS. 1–7.

As shown in FIG. 1, the electronic component mounting base board 81 of this embodiment comprises an insulating substrate 5 provided with conductor circuits 3 and a mount portion 51 for an electronic component, and a heat slug 1 adhered to the insulating substrate 5. The heat slug 1 is comprised of a flat main body 15 arranged facing to the insulating substrate 5 and a projection portion 13 extending vertically from a side face 19 of the main body 15. The main body 15 is adhered to the insulating substrate 5 through a resin adhesive layer 2, while the projection portion 13 is inserted into a positioning hole 6 and joined to the insulating substrate 5 through a solder 4.

The heat slug 1 has a slit 11 absorbing deformation of the insulating substrate 5 between a resin-adhered region 12 of the main body 15 and a solder-joined region 14 of the projection portion 13. Concretely, thee slit 11 is formed in a periphery of a part of the main body 15 extending the projection portion. The slit 11 is a deforming portion absorbing the deformation of the insulating substrate.

As shown in FIGS. 2 and 3, the slit 11 is closed at an end portion 111 of the slit 11 and extends curvedly therefrom. The end portion 111 of the slit 11 has a joint portion 17 connecting the resin-adhered region 12 to the solder-joined region 14. A minimum width A of the joint portion 17 is 0.6 mm, which is 2 times a thickness (0.3 mm) of the heat slug 1.

The other end portion 119 of the slit 11 is opened to the side face 19 of the heat slug 1.

Each of the slit 11 and the projection portion 13 is symmetrically disposed every four in relation to a center C of the heat slug C. As shown in FIG. 3, the width of the projection portion 13 becomes narrow toward its top end, in which a width of a portion 138 adjacent to the main body is 0.9 mm and a width of the top end 139 is 0.7 mm. The top end 139 of the projection portion 13 protrudes downward from the main body 15 of the heat slug 1 by 0.3 mm.

As shown in FIG. 2, the heat slug 1 has an approximately octagonal form having a side of 28 mm. As previously mentioned, four slits 11 and four projection portions 13 are disposed on alternate sides among eight sides. Distances D1 and D2 from two straight lines C1 and C2 connecting centers of opposed sides having no slit and projection portion to the projection portion 13 are 10.54 mm and 11.808 mm, respectively. And also, a distance E1 from a side having the slit and the projection portion to an outer end of the projection portion 13 is 0.2 mm, and a distance E2 from the outer edge of the projection portion 13 to an outer parallel face of the slit 11 is 0.4 mm, and a slit width B is 0.5 mm.

On the upper face and the lower face of the insulating substrate 5 are formed various conductor circuits 3. As shown in FIG. 6, the conductor circuit 3 formed on the upper face of the insulating substrate 5 comprises bonding pads 30 disposed around a mount portion 51 for an electronic component, wiring circuits 31, pads 33 for joining solder balls and a land 302 disposed around the positioning hole 6.

As shown in FIG. 7, the conductor circuit 3 formed on the lower face of the insulating substrate 5 comprises a land 303 disposed around the positioning hole 6, and a wide-width wiring pattern 35 disposed around the mount portion 51 for the electronic component in which the land 303 is electrically connected to the wiring pattern 35.

And also, the heat slug 1 is electrically connected to the wiring pattern 35 through the positioning hole 6, which are used as a ground circuit.

The insulating substrate 5 has a thickness of 1 mm, and the positioning hole has a diameter of 1 mm. As shown in FIG. 1, the mount portion 51 for the electronic component is a portion defined by a through-hole 510 formed in the insulating substrate 5 and the heat slug 1 covering one side of the through-hole. Both surfaces (upper face and lower face) of the insulating substrate are covered with a solder resist 7, respectively.

The production of the electronic component mounting base board according to the first embodiment will be described below.

At first, an insulating substrate is provided by impregnating a glass cloth with a thermosetting resin (e.g. epoxy resin). Then, a through-hole 510 for the formation of an electronic component mount portion and positioning holes 6 are formed in the insulating substrate 5 by using a piercing device such as drill or the like as shown in FIG. 1.

Next, a metal plated film 301 is formed on an inner wall of the positioning hole 6 according to usual manners such as plating, light exposure, etching and the like, while conductor circuits 3 are formed on the upper face and the lower face of the insulating substrate 5 as shown in FIGS. 6 and 7, and further solder resists 7 are formed thereon, respectively. In this case, the positioning holes 6, periphery of the mount portion 51 and pads 33 for joining solder ball are exposed without being covered with the solder resist 7.

Separately, there is provided a metal plate of 0.3 mm in thickness and made from oxygen free copper. The metal plate is subjected to an outer profile work with a mold, whereby a heat slug 1 having an approximately octagonal form is formed and four projection portions 13 are extended form alternate side faces as shown in FIGS. 2 and 3. Thereafter, the heat slug 1 is subjected to laser beam machining to form an elongated slit 11 at a position adjacent to the projection portion 13. Next, the projection portion 13 is folded downward with a mold.

Then, the heat slug 1 is disposed on the upper face of the insulating substrate 5 through a resin adhesive layer 2 as shown in FIGS. 1 and 5. In this case, the projection portion 13 of the heat slug 1 is inserted into the respective positioning hole 6, whereby the heat slug 1 is exactly positioned to the insulating substrate 5 as shown in FIGS. 4 and 5.

As the resin adhesive layer 2 is used a prepreg formed by impregnating a glass cloth with a thermosetting resin (e.g. epoxy resin).

Next, the heat slug 1 is adhered to the insulating substrate 5 by thermosetting the resin adhesive layer 2, whereby a resin-adhered region 12 is formed in a main body 15 of the heat slug 1 inward from the slit 11.

Thereafter, a ball solder 4 is fed onto each of the positioning holes 6 at a side of the insulating substrate 5 not adhered to the heat slug 1 and fused by heating, whereby the solder 4 is filled in the positioning hole 6 to form a fillet 40 between the positioning hole 6 and the projection portion 13.

When the solder 4 is fed into the positioning hole 6, as shown in FIG. 6, a ball solder is fed onto the respective pad 33 and joined thereto by fusion under heating.

An electronic component mounting base board 81 is obtained as mentioned above.

Thereafter, an electronic component 52 is joined to an inside of the mount portion 51 through an adhesive 53 such as silver paste or the like and connected to the bonding pads 30 through bonding wires 55 (shown by phantom lines) as shown in FIGS. 1 and 6. Then, a sealing resin 54 is filled in the mount portion 51 so as to cover the electronic component 52.

The functions and effects of the first embodiment of the invention will be described below.

In the electronic component mounting base board according to the first embodiment, as shown in FIG. 1, the slit 11 is arranged between the resin-adhered region 12 of the main body 15 and the solder-joined region of the projection portion 13 in the heat slug 1. The slit 11 is a deforming portion following the deformation of the insulating substrate 5, so that when the mount portion 51 for the electronic component is sealed with the resin, not only the deformation of the insulating substrate 5 but also the deformation of the slit 11 in the heat slug 1 accompanied therewith are caused, whereby the occurrence of warping in the insulating substrate 5 can be prevented.

As shown in FIG. 4, the main body 15 of the heat slug 1 is adhered to the insulating substrate 5 through the resin adhesive layer 2 made from a soft material, so that the resin adhesive layer 2 can absorb the deformation of the insulating substrate 5 and hence the warping of the insulating substrate 5 can more effectively be controlled.

Further, the projection portion 13 of the heat slug 1 is inserted into the positioning hole 6 and strongly joined thereto through the solder 4, so that the heat slug 1 is surely connected to the insulating substrate 5.

And also, the deformable slit 11 is arranged between the resin-adhered region 12 of the main body 15 and the solder-joined region 14 of the projection portion 13 as mentioned above, so that it is possible to prevent the influence of the deformation of the insulating substrate 5 upon the solder-joined region 14 and hence a strong solder joining strength can be maintained between the projection portion 13 and the positioning hole 6 in the insulating substrate 5.

The projection portion 13 is a portion extending integrally from a side face 19 of the main body 15 and joined to the positioning hole 6 through the solder, so that the joining area of the heat slug 1 is increased to provide a high joining strength between the heat slug 1 and the insulating substrate 5. And also, there is improved an electrically connecting reliability between the heat slug 1 and the positioning hole 6. Moreover, the projection portion 13 serves as an escape of heat generated from the electronic component 52 to improve heat dissipation effect.

Since the positioning between the heat slug 1 and the insulating substrate 5 is carried out by inserting the projection portion 13 into the positioning hole 6, the quality and productivity of the electronic component mounting base board 81 are improved and also the simplification of production steps and the reduction of cost can be attained.

Figure 9:
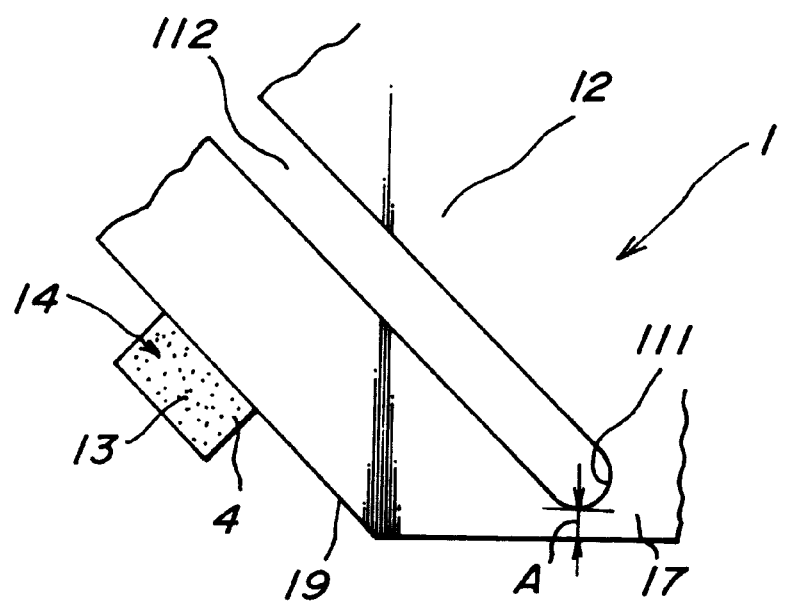
FIG. 9 is a diagrammatically enlarged plan view of a main part in the vicinity of a slit of the heat slug in the second embodiment.

A second embodiment of the electronic component mounting base board according to the invention is shown in FIGS. 8 and 9, in which both end portions 111, 119 of the slit 112 are closed by the joint portion 17 connecting the resin-adhered region 12 to the solder-joined region 14.

As shown in FIG. 9, the minimum width A of the joint portion 17 is 0.15 mm, which is a half of thickness (0.3 mm) of the heat slug 1. The slit 112 is arranged in an elongated form in parallel to the side face 19 of the heat slug 1. Further, the projection portion 13 is connected to the positioning hole at a solder-joined region 14 adhered with the solder 4.

The other structure of the second embodiment is the same as the first embodiment.

In the second embodiment, both end portions 111, 119 of the slit 112 are closed by the joint portion 17 as shown in FIG. 8, so that the connection strength between the resin-adhered region 12 and the solder-joined region 14 becomes higher.

The same effects as in the first embodiment can be obtained even in the second embodiment.

A third embodiment of the electronic component mounting base board (83) according to the invention is shown in FIGS. 10 and 11. As shown in FIG. 10, a slit 113 is formed in a projection portion 131 of the heat slug 1. The slit 113 is disposed along an extending direction of the projection portion 131.

The width K of the slit 113 is 0.5 mm, which is 55% of a width G (0.9 mm) of the projection portion 131. The projection portion 113 extends from the main body 15 of the heat slug 1 by 0.5 mm, in which a portion corresponding to a length H of 0.4 mm is folded downward.

The width of the slit 113 is favorable to be 30–99% of a width of a portion 138 adjacent to the main body of the heat slug 1. Thus, the strength of the heat slug can be increased. Moreover, the heat slug 1 has substantially the same octagonal form as in the first embodiment, in which four projection portions 131 are disposed on alternate sides.

As shown in FIG. 11, the projection portion 131 of the heat slug 1 is inserted into the positioning hole 6 of the insulating substrate 5 and a top end part 139 thereof is joined through the solder 4 without adhering the solder 4 to the slit 113 of the projection portion 131. If the solder 4 is adhered to the slit 113, the deformation of the slit 113 is suppressed and hence the deformation of the insulating substrate 5 is hardly absorbed.

The heat slug 1 is adhered to the insulating substrate 5 through the resin adhesive layer 2 at the resin-adhered region 12.

The other structure of the third embodiment is the same as in the first embodiment.

In the third embodiment, the slit 113 formed in the projection portion 131 is a portion capable of freely deforming in accordance with the deformation of the insulating substrate 5. Therefore, the slit 113 can absorb the deformation of the insulating substrate 5 to prevent the occurrence of warping in the insulating substrate 5 likewise the first embodiment.

The same effects as in the first embodiment can be obtained even in the third embodiment.

Figure 12:
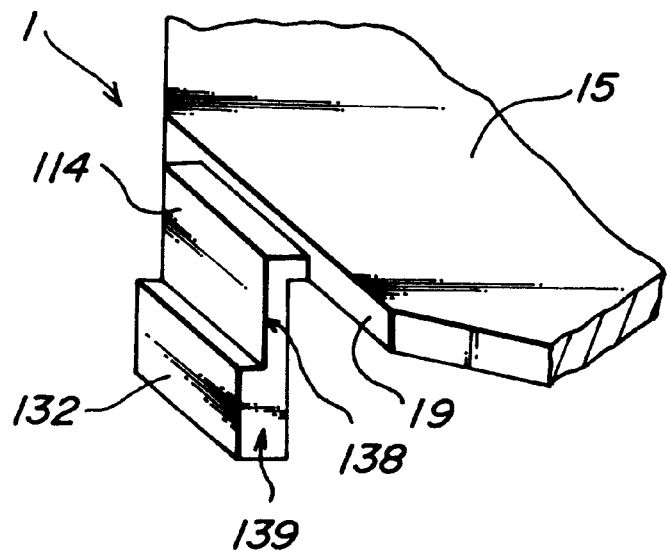
FIG. 12 is a partial perspective view of a heat slug in a fourth embodiment of the invention.
Figure 13:
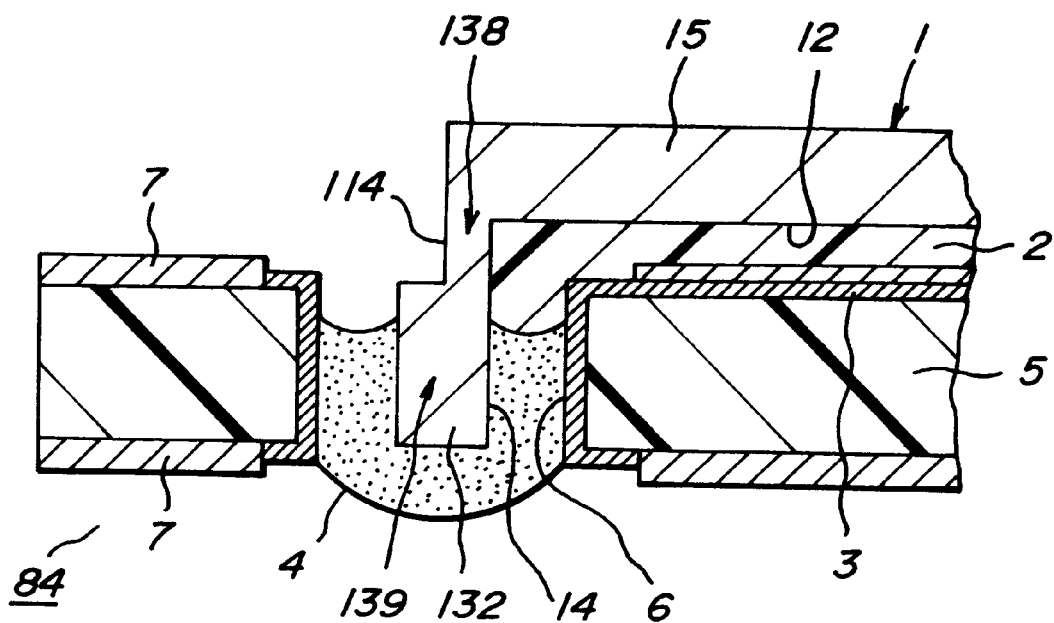
FIG. 13 is a diagrammatically section view of a main part of the electronic component mounting base board in the fourth embodiment.

A fourth embodiment of the electronic component mounting base board (84) according to the invention is shown in FIGS. 12 and 13. As shown in FIG. 12, a thin portion 114 is formed in a part of a projection portion 132 adjacent to the main body 15.

The thickness of the thin portion 114 is 0.1 mm, and the thickness of the main body 15 in the heat slug 1 is 0.3 mm. The thickness of a top end part 139 of the projection portion 132 is the same as in the main body 15.

As shown in FIG. 13, the projection portion 132 of the heat slug 1 is inserted into the positioning hole 6 of the insulating substrate 5, and the top end region 139 thereof is joined with the solder 4 without adhering the solder 4 to the thin portion 114 of the projection portion 132 likewise the third embodiment.

The heat slug 1 is adhered to the insulating substrate 5 through the resin adhesive layer 2 at the resin-adhered region 12.

The other structure of the fourth embodiment is the same as in the first embodiment.

In the fourth embodiment, the thin portion 114 formed in the projection portion 132 is a portion capable of freely deforming in accordance with the deformation of the insulating substrate 5. Therefore, the thin portion 114 can absorb the deformation of the insulating substrate 5 to prevent the occurrence of warping in the insulating substrate 5 likewise the first embodiment.

The same effects as in the first embodiment can be obtained even in the fourth embodiment.

Figure 14:
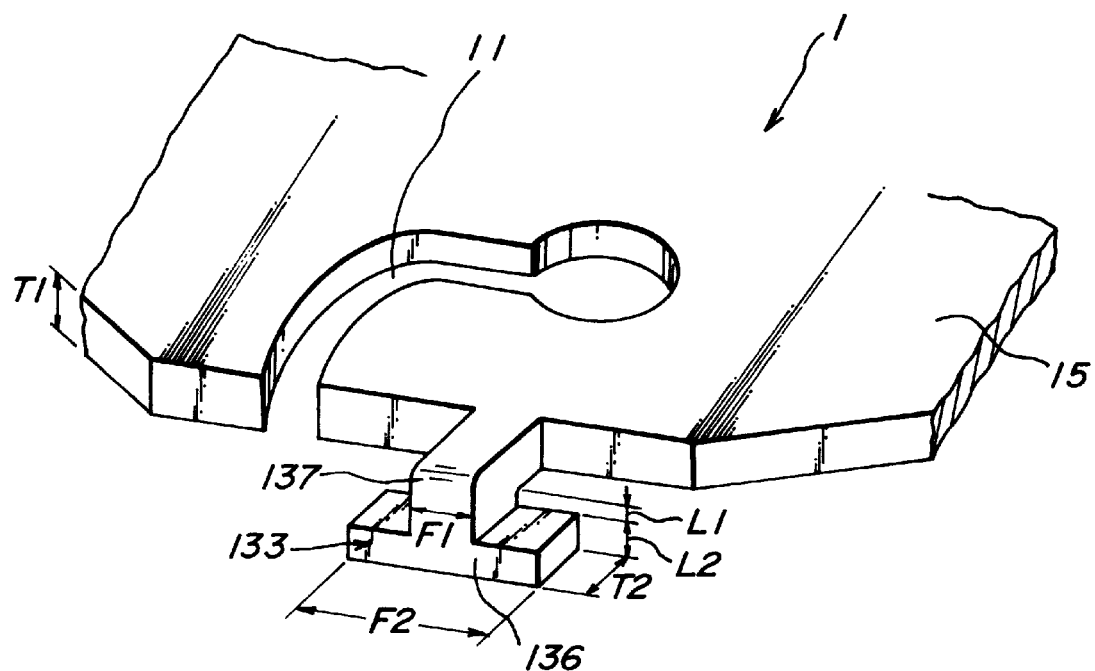
FIG. 14 is a partial perspective view of a heat slug in a fifth embodiment of the invention.

A fifth embodiment of the electronic component mounting base board according to the invention is shown in FIG. 14.

As shown in FIG. 14, a projection portion 133 of the heat slug 1 is a reverse T-shaped form. The projection portion 133 is comprised of an upper part 137 having a width F1 of 0.4 mm and a lower part 136 having a width F2 of 0.8 mm. The upper part 137 has a length L1 of 0.1 mm, while the lower part 136 has a length L2 of 0.2 mm. The upper part 137 and lower part 136 of the projection portion 133 are inserted into the positioning hole. And also, the same elongated slit 11 as in the first embodiment is formed in the main body 15 of the heat slug 1. The thickness T1 of the heat slug 1 and the thickness T2 of the projection portion 133 are 0.3 mm, respectively.

Moreover, the thickness of the upper part 137 in the projection portion 133 may be made thinner than the thickness (0.3 mm) of the main body 15 in the heat slug 1.

The other structure of the fifth embodiment is the same as in the first embodiment.

The lower part 136 of the projection portion 133 has a width wider than that of the upper part 137, so that the projection portion 133 is fixed to the inner wall of the positioning hole at the lower part 136 to prevent the loosening to the positioning hole. And also, the heat slug 1 can exactly be positioned to the insulating substrate 5.

The same effects as in the first embodiment can be obtained even in the fifth embodiment.

As mentioned above, according to the invention, there can be provided an electronic component mounting base board capable of preventing the warping of the insulating substrate when a mount portion for the electronic component is sealed with the resin.

What is claimed is:

1. An electronic component mounting base board, comprising:

an insulating substrate provided with a conductor circuit and a mount portion for an electronic component, and a heat slug adhered to the insulating substrate, said heat slug including a flat main body facing the insulating substrate and a projection portion extending vertically from a side face of the main body, the main body being adhered to the insulating substrate through a resin adhesive layer, and the projection portion being inserted into a positioning hole and joined to the insulating substrate through solder, and the heat slug being provided with a deforming portion that absorbs deformation of the insulating substrate between a resin-adhered region of the main body and a solder-joint region of the projection portion.

2. An electronic component mounting base board according to claim 1, wherein the deforming portion is formed in a part of the periphery of the main body and extends proximate the projection portion of the heat slug.

3. An electronic component mounting base board according to claim 1, wherein the deforming portion is formed proximate a part of the projection portion adjacent to the main body.

4. An electronic component mounting base board according to claim 1, wherein the deforming portion is a slit, the slit having a first end portion and a second end portion.

5. An electronic component mounting base board according to claim 4, wherein the first end portion of the slit is opened and the second end portion is closed by a joint portion connecting the resin-adhered region to the solder-joined region.

6. An electronic component mounting base board according to claim 4, wherein both end portions of the slit are closed by a joint portion connecting the resin-adhered region to the solder-joined region.

7. An electronic component mounting base board according to claim 5, wherein the second end portion of the slit closed by the joint portion forms a curved surface.

* * * * *